United States Patent
Cheng et al.

(10) Patent No.: US 12,369,362 B2
(45) Date of Patent: *Jul. 22, 2025

(54) FORMING SEMICONDUCTOR STRUCTURES WITH TWO-DIMENSIONAL MATERIALS

(71) Applicant: Taiwan Semiconductor Manufacturing Co., Ltd., Hsinchu (TW)

(72) Inventors: Chao-Ching Cheng, Hsinchu (TW); Hung-Li Chiang, Hsinchu (TW); Chun-Chieh Lu, Hsinchu (TW); Ming-Yang Li, Hsinchu (TW); Tzu-Chiang Chen, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/759,611

(22) Filed: Jun. 28, 2024

(65) Prior Publication Data

US 2024/0355914 A1   Oct. 24, 2024

Related U.S. Application Data

(63) Continuation of application No. 18/160,256, filed on Jan. 26, 2023, now Pat. No. 12,046,665, which is a continuation of application No. 17/240,482, filed on Apr. 26, 2021, now Pat. No. 11,600,720, which is a continuation of application No. 16/573,892, filed on Sep. 17, 2019, now Pat. No. 11,004,965.

(51) Int. Cl.
*H10D 48/36* (2025.01)
*H10D 30/62* (2025.01)
*H10D 30/67* (2025.01)

(52) U.S. Cl.
CPC .......... *H10D 48/362* (2025.01); *H10D 30/62* (2025.01); *H10D 30/6737* (2025.01)

(58) Field of Classification Search
CPC .. H10D 30/62; H10D 30/6737; H10D 48/362; H10D 30/47; H10D 62/80; H10D 62/82; H10D 30/472
See application file for complete search history.

(56) References Cited

U.S. PATENT DOCUMENTS

| | | | |
|---|---|---|---|
| 11,004,965 B2 | 5/2021 | Cheng et al. | |
| 11,600,720 B2 | 3/2023 | Cheng et al. | |
| 12,046,665 B2 * | 7/2024 | Cheng | H10D 30/6757 |
| 2018/0182898 A1 | 6/2018 | Moroz et al. | |
| 2019/0074381 A1 | 3/2019 | Park et al. | |

* cited by examiner

Primary Examiner — Changhyun Yi
(74) Attorney, Agent, or Firm — Seed IP Law Group (57) ABSTRACT

A process is provided to fabricate a finFET device having a semiconductor layer of a two-dimensional "2D" semiconductor material. The semiconductor layer of the 2D semiconductor material is a thin film layer formed over a dielectric fin-shaped structure. The 2D semiconductor layer extends over at least three surfaces of the dielectric fin structure, e.g., the upper surface and two sidewall surfaces. A vertical protrusion metal structure, referred to as "metal fin structure", is formed about an edge of the dielectric fin structure and is used as a seed to grow the 2D semiconductor material.

20 Claims, 9 Drawing Sheets

FORMING SEMICONDUCTOR STRUCTURES WITH TWO-DIMENSIONAL MATERIALS

BACKGROUND

This disclosure relates generally to fabricating semiconductor structures, and in some embodiments, to a process for forming a semiconductor structure including two-dimensional materials.

Two-dimensional (2D) materials have been a focus of recent research efforts to exploit their novel electronic properties and great potentials in semiconductor technologies, stimulated by the successful fabrication of graphene. Although graphene includes high carrier mobility value, its zero-bandgap nature, i.e., the semimetallic properties, limits its application in semiconductor devices. The 2D allotrope of black phosphorus, phosphorene, is another widely studied 2D material, which is expected to have high mobility values and visible bandgap. One disadvantage of phosphorene is its rapid degradation under the atmospheric condition.

BRIEF DESCRIPTION OF THE DRAWINGS

Aspects of the present disclosure are best understood from the following detailed description when read with the accompanying figures. In the drawings, identical reference numbers identify similar elements or acts unless the context indicates otherwise. The sizes and relative positions of elements in the drawings are not necessarily drawn to scale. In fact, the dimensions of the various features may be arbitrarily increased or reduced for clarity of discussion.

DETAILED DESCRIPTION

Techniques in accordance with embodiments described herein are directed to a novel process to fabricate a finFET device having a semiconductor layer of a 2D semiconductor material, referred to as "2D semiconductor layer". The 2D semiconductor layer is a thin film layer formed over a dielectric fin-shaped structure, referred to as "dielectric fin structure". Specifically, for example, the 2D semiconductor layer extends over at least three surfaces of the dielectric fin structure, the upper surface and two sidewall surfaces. A vertical protrusion metal structure, referred to as "metal fin structure", is formed about an edge of the dielectric fin structure and is used as a seed to grow the 2D material of the semiconductor layer. The metal fin structure may be configured as a body contact terminal or may be configured as a source/drain terminal. A gate structure is formed wrapping around three surfaces a portion of the 2D semiconductor layer over the three surfaces of the dielectric fin structure. In the case that the metal fin structure is configured as the body contact, a source/drain structure is formed over the 2D semiconductor layer and between the gate structure and the metal fin structure. A dielectric spacer structure separates the source/drain structure from the gate structure.

In another embodiment, the dielectric fin structure includes a metal structure embedded within the dielectric material. Specifically, the embedded metal structure is separated from the 2D semiconductor layer by the dielectric material. The embedded metal structure may be configured as a gate structure in additional to or substituting the gate structure that is formed over the 2D semiconductor material. In an example, the embedded gate structure is configured as a back gate and the gate structure formed over the 2D semiconductor layer is configured as a top gate.

The 2D semiconductor material includes a relatively small thickness such that the 2D semiconductor material exhibits semiconductor properties instead of semimetal or insulator properties. The vertical metal fin structure facilitates the formation of the thin film of the 2D semiconductor material over the dielectric fin structure. The dielectric fin structure may be adjacent to a metal fin structure at one edge of the dielectric fin structure or may be adjacent to two metal fin structures from both edges of the dielectric fin structure. In the latter scenario, one or both of the metal fin structures may be used as a seed for growth of the 2D semiconductor material over the dielectric fin structure.

The disclosure herein provides many different embodiments, or examples, for implementing different features of the described subject matter. Specific examples of components and arrangements are described below to simplify the present description. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

The following description references a transistor as an example of a semiconductor structure to which the present description applies; however, the present description is not limited in applicability to transistors. For example, the follow description applies to other types of semiconductor structures that are not transistors where the provision of low resistance electrical contact at junctions between features exhibiting semiconductor properties and features exhibiting electrical conductive properties, e.g., metal properties are desirable.

Figure 1:
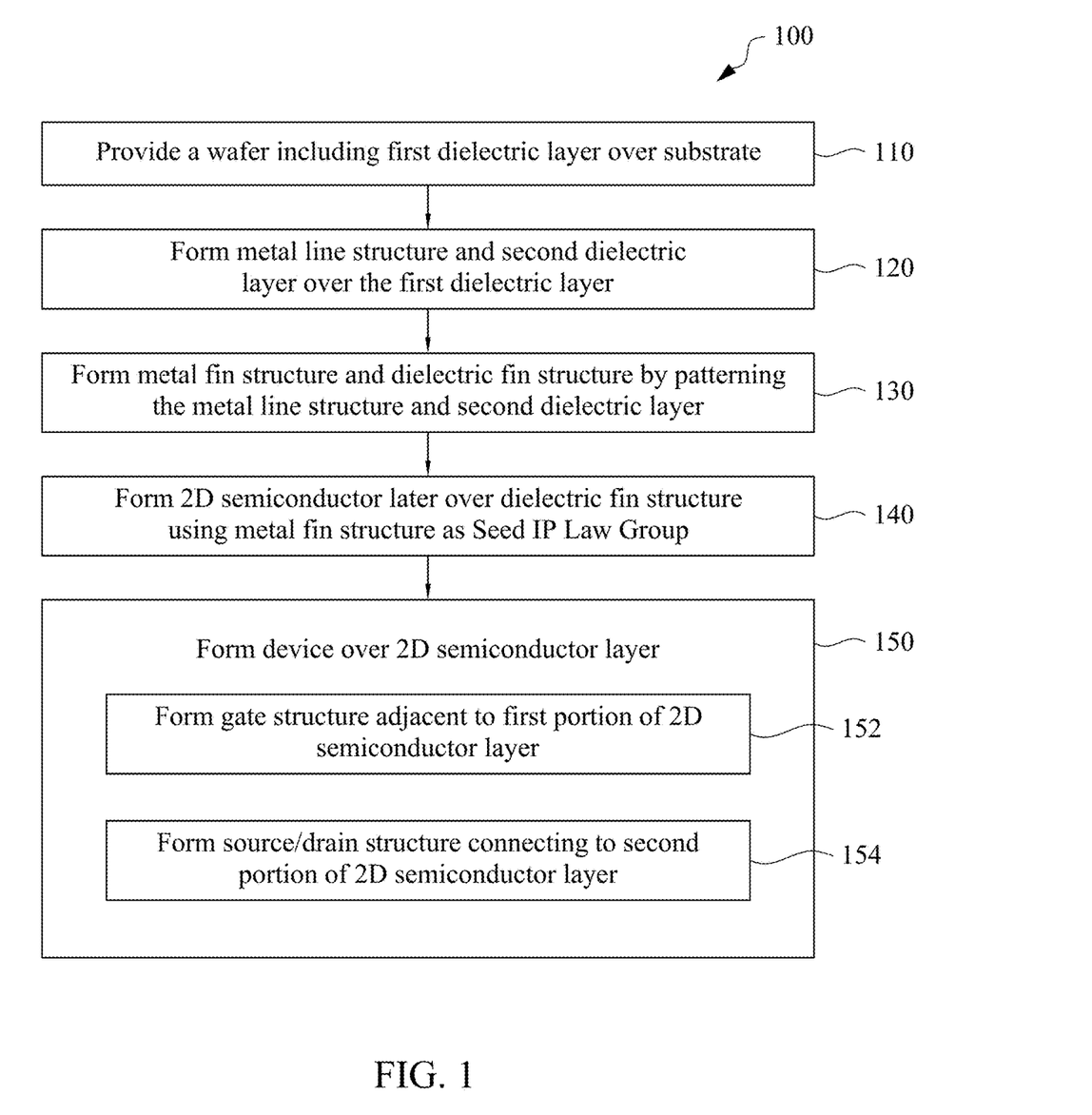
FIG. 1 illustrates an example process of making a 2D material according to embodiments of the disclosure.

FIG. 1 illustrates an example fabrication process 100. FIGS. 2-8 illustrate a wafer 200 under various stages of making a device under the example fabrication process 100. In each of the FIGS. 2-8, one or more of perspective view, top view or cross-sectional view from various cross-sectional planes of the wafer 200 may be shown. In a case that a figure includes more than one views of the wafer 200, capital letter "A" is used to refer to a perspective view, capital letter "B" is used to refer to a top view and capital letter "C" is used to refer to a cross-sectional view from a cross-sectional line C-C marked on the related perspective view "A" or top view "B" figures.

As used herein, consistent with the accepted definition within solid-state material art, a "2D material" refers to a crystalline material consisting of a single layer of atoms. As widely accepted in the art, "2D material" may also be referred to as a "monolayer" material. In this disclosure, "2D material" and "monolayer" material are used interchangeably without differentiation in meanings, unless specifically pointed out otherwise.

Figure 2:
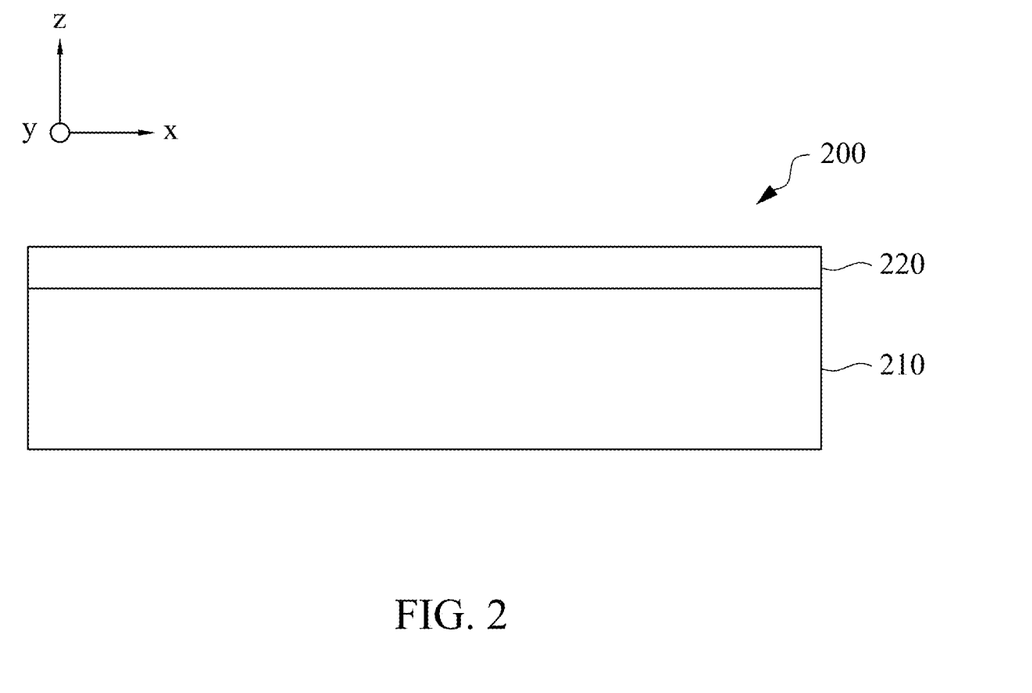
FIGS. 2-3 illustrate cross-sectional views of an example wafer at various stages of fabrication according to embodiments of the disclosure.

Referring to FIG. 1, with reference also to FIG. 2, in example operation 110, a wafer 200 is provided. The wafer 200 includes a substrate 210 and a first dielectric layer 220 over the substrate 210. In an embodiment, the substrate 210 is a semiconductor substrate, e.g., of silicon, silicon germanium, and/or other suitable semiconductor materials. For example, the other suitable semiconductor materials of the substrate 210 may include a compound semiconductor such as silicon carbide, gallium arsenide, indium arsenide, and/or indium phosphide. Further, the substrate 210 may also include a silicon-on-insulator (SOI) structure.

The first dielectric layer 220 is silicon oxide, silicon nitride or other suitable dielectric material.

Figure 3:
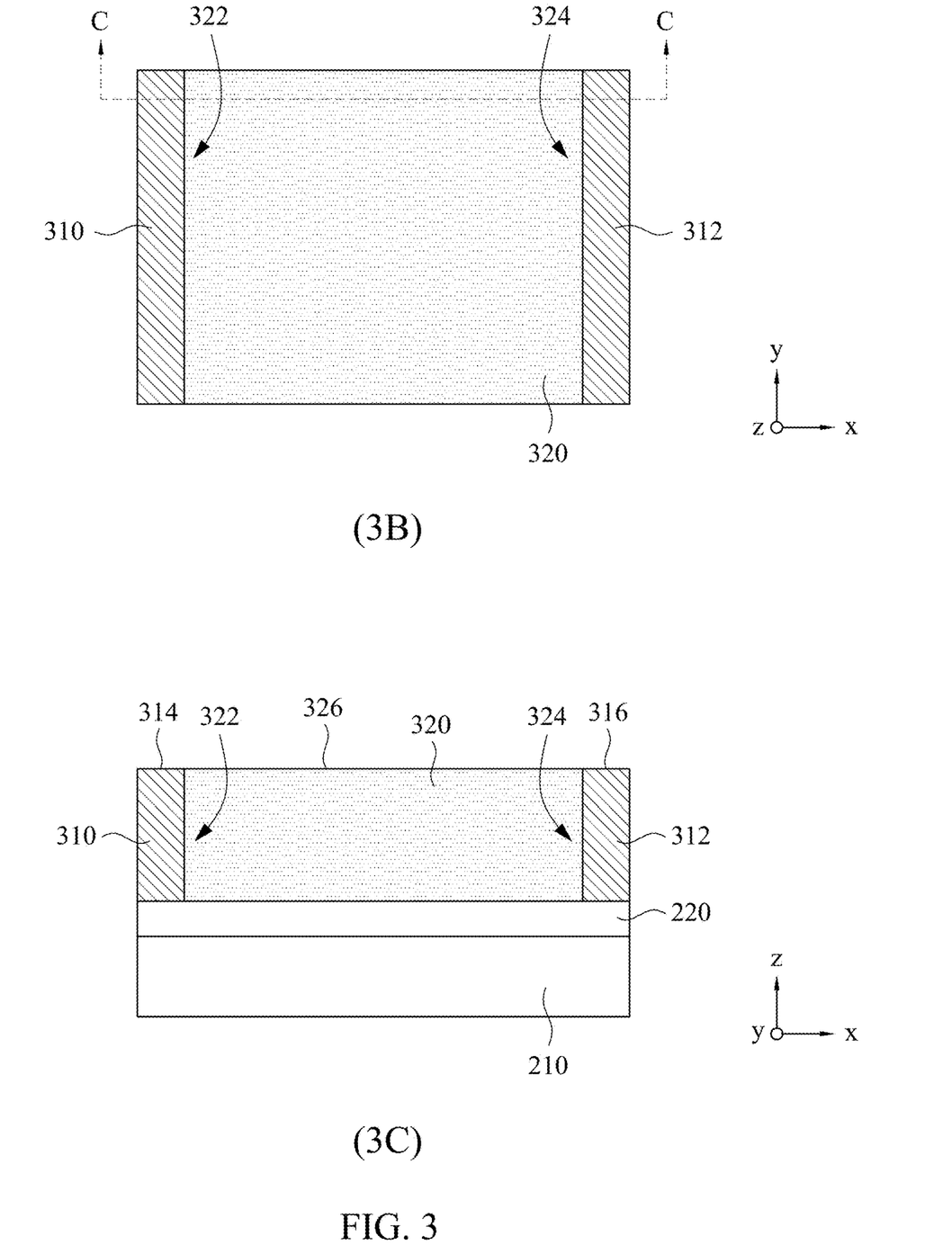

In example operation 120, with reference also to FIG. 3, a metal line structure 310, 312 and a second dielectric layer 320 are formed over the first dielectric layer 220. The second dielectric layer 320 is formed adjacent to the metal line structures 310, 312 at two opposite edges 322, 324 of the second dielectric layer 320, respectively. For example, the second dielectric layer extends from a metal line structure 310, 312 or between two metal line structures 310, 312 in a first direction, here, the x-axis direction. FIG. 3 shows, as an illustrative example, that the upper surface 326 of the second dielectric layer 320 is substantially at a same level as one or more of the upper surfaces 314, 316 of the metal line structures 310, 312, which does not limit the scope of the disclosure.

Various processes may be used to form the second dielectric layer 320 adjacent to the metal line structures 310, 312. For example, a damascene procedure may be used. In a damascene process, the second dielectric layer 320 may be blanket formed first and then pattern to have trenches, which the metal line structures 310, 312 are formed. Alternatively, a metal layer may be formed first and patterned to form the metal line structures 310, 312 and the second dielectric layer 320 is subsequently formed adjacent to the metal line structures 310, 312. Further, the metal line structures 310, 312 may be formed through a lift-up process, which is followed by the formation of the second dielectric layer 320.

Deposition approaches for the dielectric layer 320 includes, but are not limited to, thermal deposition processes like chemical vapor deposition (CVD), atomic layer deposition (ALD) and remote oxygen scavenging, molecular beam deposition, plasma processes like physical vapor deposition (PVD) and ionized PVD, plating, or other suitable process.

Deposition approaches for the metal layer 310, 312 includes, but are not limited to PVD, CVD, plating or other suitable process.

Figure 4:
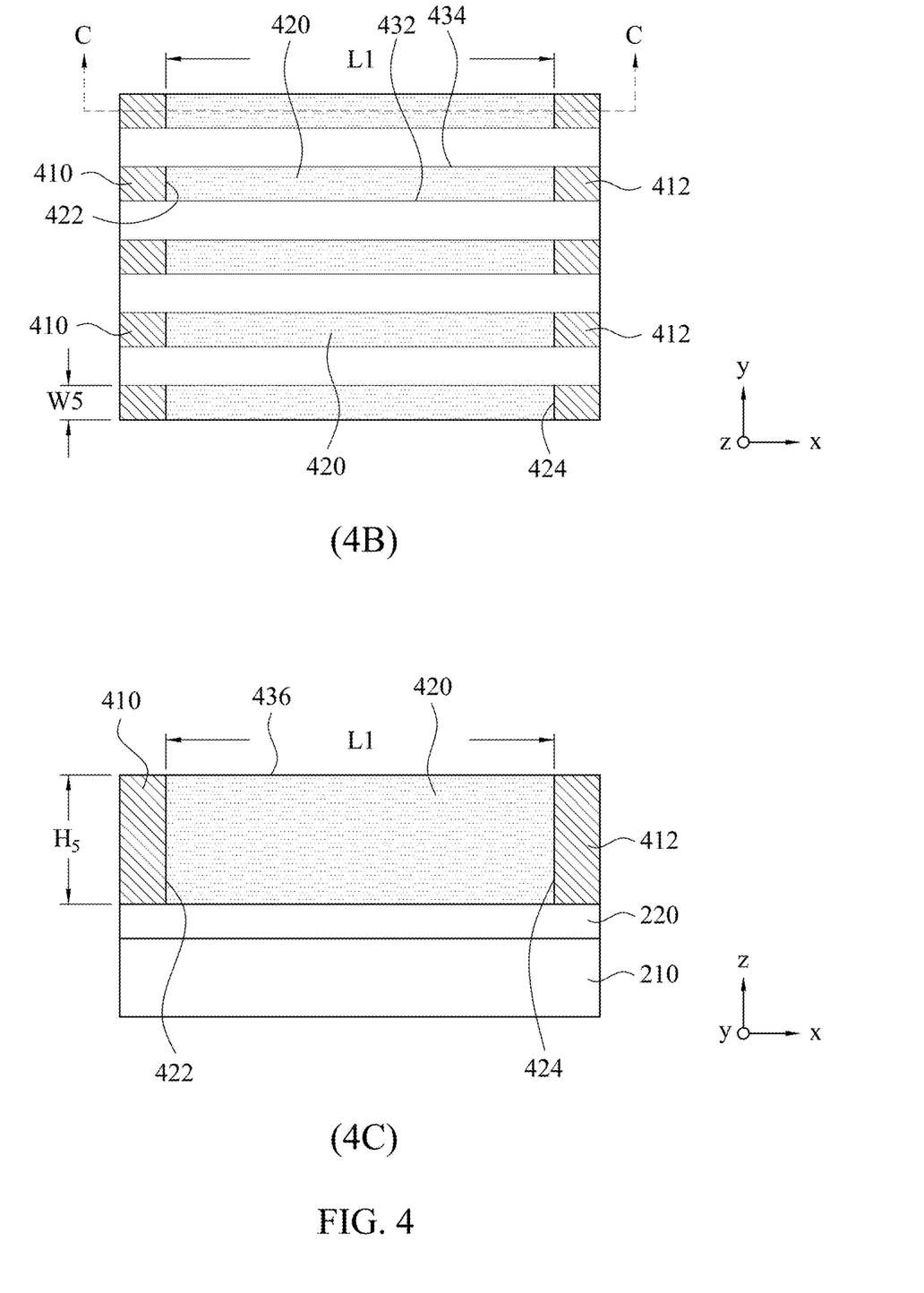
FIG. 4 illustrates an example process of making a semiconductor device including a 2D material according to embodiments of the disclosure.

In example operation 130, with reference also to FIG. 4, the metal line structures 310, 312 and the second dielectric layer 320 are patterned to form metal fin structures 410, 412, and dielectric fin structures 420. A longitudinal dimension L1 of the dielectric fin structures 420 are oriented along the first direction, here the x-axis direction. That is, the longitudinal dimension L1 extends between the metal fin structures 410, 412. The metal fin structures 410, 412 are referred to as "fin structure" for descriptive purposes only. The structures 410, 412 may not shape like a fin structure and may shape like a vertical column or other vertical towers. The dielectric fin structure 420 interfaces with the metal fin structures 410, 412 with the edge surfaces 422, 424, respectively.

The dielectric fin structure 420 includes a first sidewall 432, a second sidewall 436 and an upper surface 436 meeting the first sidewall 432 and the second sidewall 434. The first sidewall 432 and the second sidewall 434 are positioned along the first direction, here the x-axis direction, and are opposite to one another. It should be appreciated that the meeting between the upper surface 436 and one or more of the first sidewall 432 or the second sidewall 434 may not always include a clear meet line and may be a smooth transition that fades the border between the upper surface 436 and the sidewall 432, 434. The upper surface 436 may not be a flat surface as shown and may be a convex surface, concave surface or may be a combination of multiple surfaces.

In an embodiment, as shown in FIG. 4, the metal fin structures 410, 412 and the dielectric fin structures 420 are formed through a same patterning process. As such, the metal fin structures 410, 412 and the dielectric fin structures 420 include substantially a same width $W_s$ in a second direction, here the y-axis direction, that is orthogonal to the first direction, here the x-axis direction. The metal fin structures 410, 412 and the dielectric fin structures 420 may also include substantially a same height $H_s$ in a third direction, here the z-axis direction, that is orthogonal to both the first direction and the second direction. This example embodiment of FIG. 4 does not limit the scope of the disclosure.

The material of the metal fin structures 410, 412 are selected based on the 2D semiconductor material to be grown using the metal fin structures 410, 412 as a seed. In an example, the metal fin structures 410, 412 are tungsten W, Molybdenum (Mo), Platinum (Pt), or other suitable metal materials.

Figure 5:
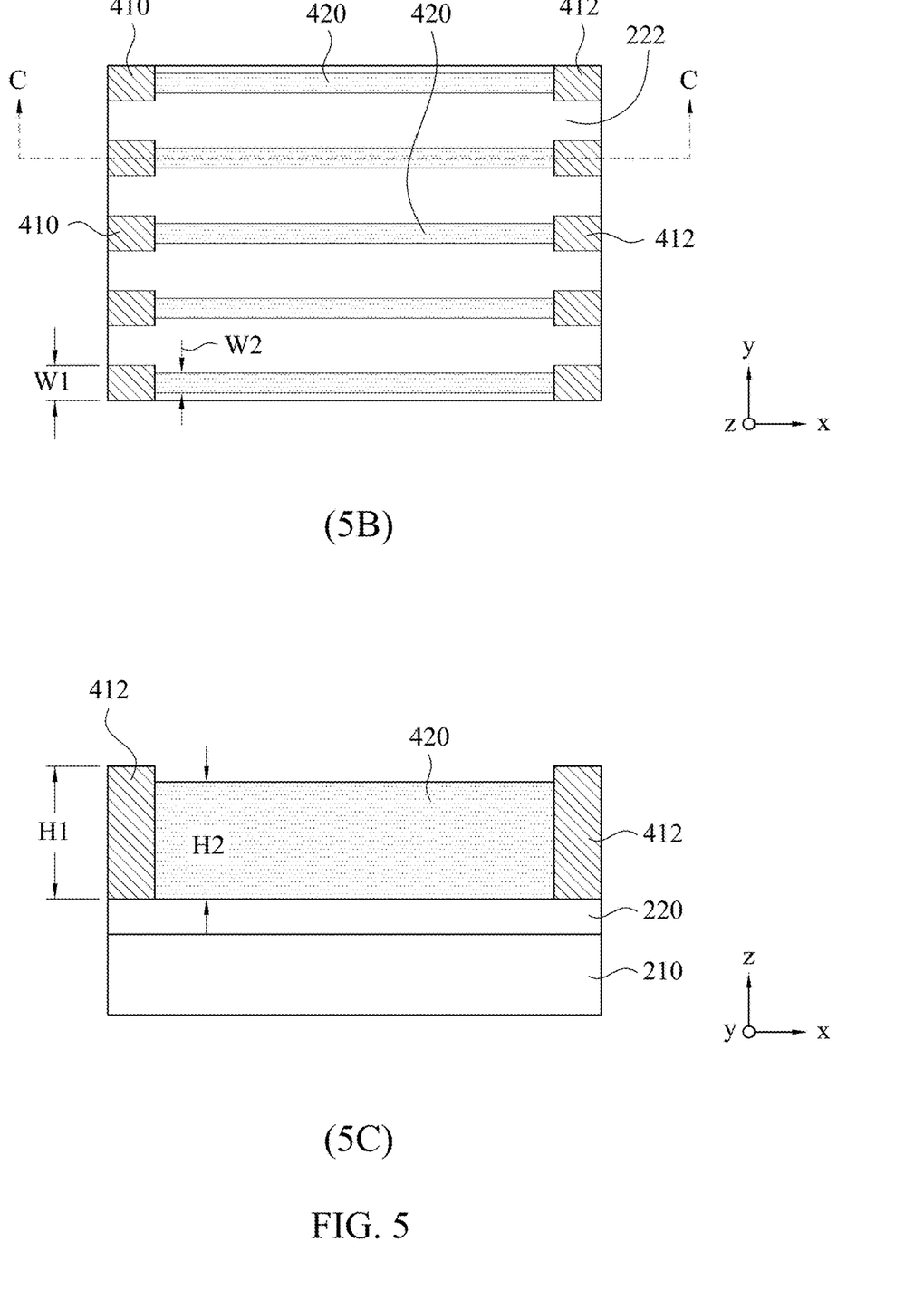
FIGS. 5-8 illustrate cross-sectional views of an example structure at various stages of fabrication according to embodiments of the disclosure.

As shown in FIG. 5, in another embodiment, the dielectric fin structure 420 is patterned to be narrower than one or more of the metal fin structure 410, 412. For example, a width W1 of the metal fin structure 410 in the second direction, here the y-axis direction, is larger than a width W2 of the dielectric fin structure 420. That is, the metal fin structure 410 extends beyond the adjacent dielectric fin structure 420 in the second direction. Further, a height H1 of the metal fin structure 410 in the third direction, here the z-axis direction, is larger than a height H2 of the dielectric fin structure 420. That is, the metal fin structure 410 extends beyond the adjacent dielectric fin structure 420 in the third direction. The portions of the metal fin structure 410 that extend beyond the adjacent dielectric fin structure 420 facilitate the growth of a 2D material extending from those portions toward covering the dielectric fin structure.

Other embodiment of the dimensions of the metal fin structure 410, 412 relative to the dielectric fin structure 420 are also possible and included in the disclosure. In the description hereinafter, the example embodiment of FIG. 5 is used as an illustrative example of the metal fin structure 410, 412 and the dielectric fin structure 420.

Figure 6:
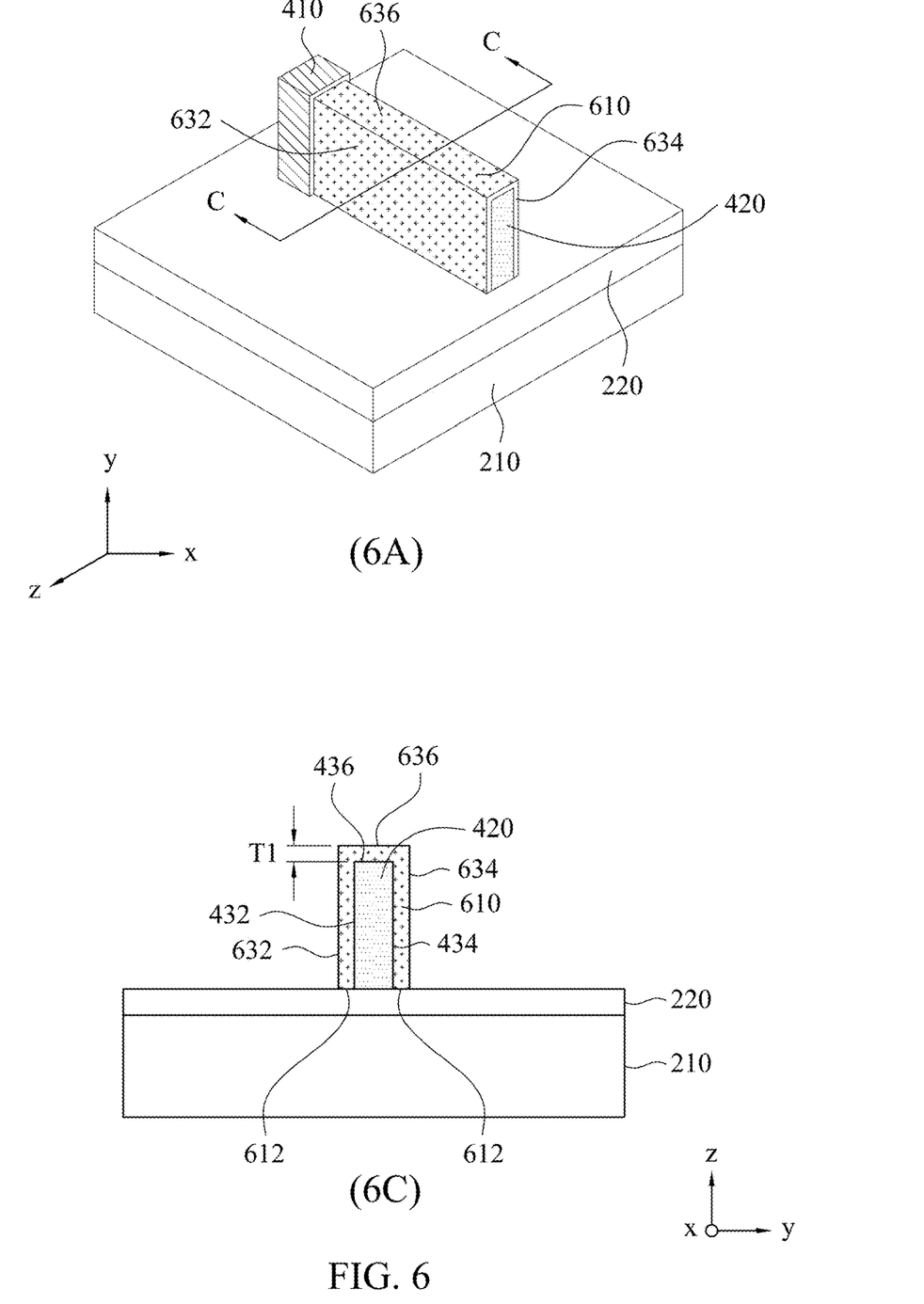

In example operation 140, with reference also to FIG. 6, a semiconductor layer 610 of a 2-dimension material is formed over the dielectric fin structure 420 using the one or more of the metal fin structure 410, 412 (410 is shown in FIG. 6). In an example, the 2D material is tungsten disulfide $WS_2$ and is formed using $WO_3$ powders and Sulfur vapor precursor. To maintain the semiconductor property of the 2D semiconductor layer 610, the thickness T1 of the 2D semiconductor layer 610 is controlled to be smaller than 2 monolayers, or smaller than 7 monolayers of the 2D material. Other 2D semiconductor materials are also possible and included in the scope of the disclosure. For example, the 2D semiconductor material may be one or more of $WSe_2$, $MoS_2$, $PtSe_2$, $PtS_2$, InSe, GeSe, GeS, SnSe, SnS, or other suitable 2D semiconductor materials. The thickness of the T1 of the 2D semiconductor layer 610 is generally within a range of about 0.5 nm to about 5 nm.

In an embodiment, the 2D semiconductor layer 610 is formed covering all exposed surfaces of the dielectric fin structure 420. Specifically, the 2D semiconductor layer 610 extends over the first sidewall 432, the upper surface 436 and the second sidewall 434 of the dielectric fin structure 420. As such, the 2D semiconductor layer 610 includes a first sidewall portion 632 over the first sidewall 432 of the dielectric fin structure 420, a second sidewall portion 634 over the second sidewall 434 of the dielectric fin structure 420, and an upper portion 636 over the upper surface 436 of the dielectric fin structure 420. The 2D semiconductor layer 610 interfaces with the first dielectric layer 220 with the bottom surfaces 612 of the 2D semiconductor layer 610.

The formation of the 2D semiconductor layer 610 may also include processes to cure or perfect the 2D semiconductor layer 610. For example, an annealing process may be performed to improve the crystallinity of the monolayers of the 2D material $WS_2$ of the 2D semiconductor layer 610. The annealing may be conducted with a temperature ranging from about 200° C. to about 400° C. and for a period of time ranging from about 7 to 15 minutes. Further, a thinning process may be performed to reduce the number of layers of the second 2D material. In an embodiment, the 2D semiconductor layer 610 may be thinned through plasma based dry etching, e.g., a reactive-ion etching, to control the electronic properties thereof.

In some embodiment, the dielectric fin structure 420 includes a layer of hexagonal boron nitride (not specifically shown) on the surface of the dielectric fin structure 420. The hexagonal boron nitride is used as an insulator for the production of ultrahigh mobility 2D hetero-structures with various types of 2D semiconductors of the 2D semiconductor layer 610, e.g. $WSe_2$, $MoSe_2$. The hexagonal boron nitride can be exfoliated into thin 2D layers, down to monolayer h-BN. The monolayer h-BN is stacked together with the 2D semiconductor layer 610 via van der Waals interactions.

Figure 7:
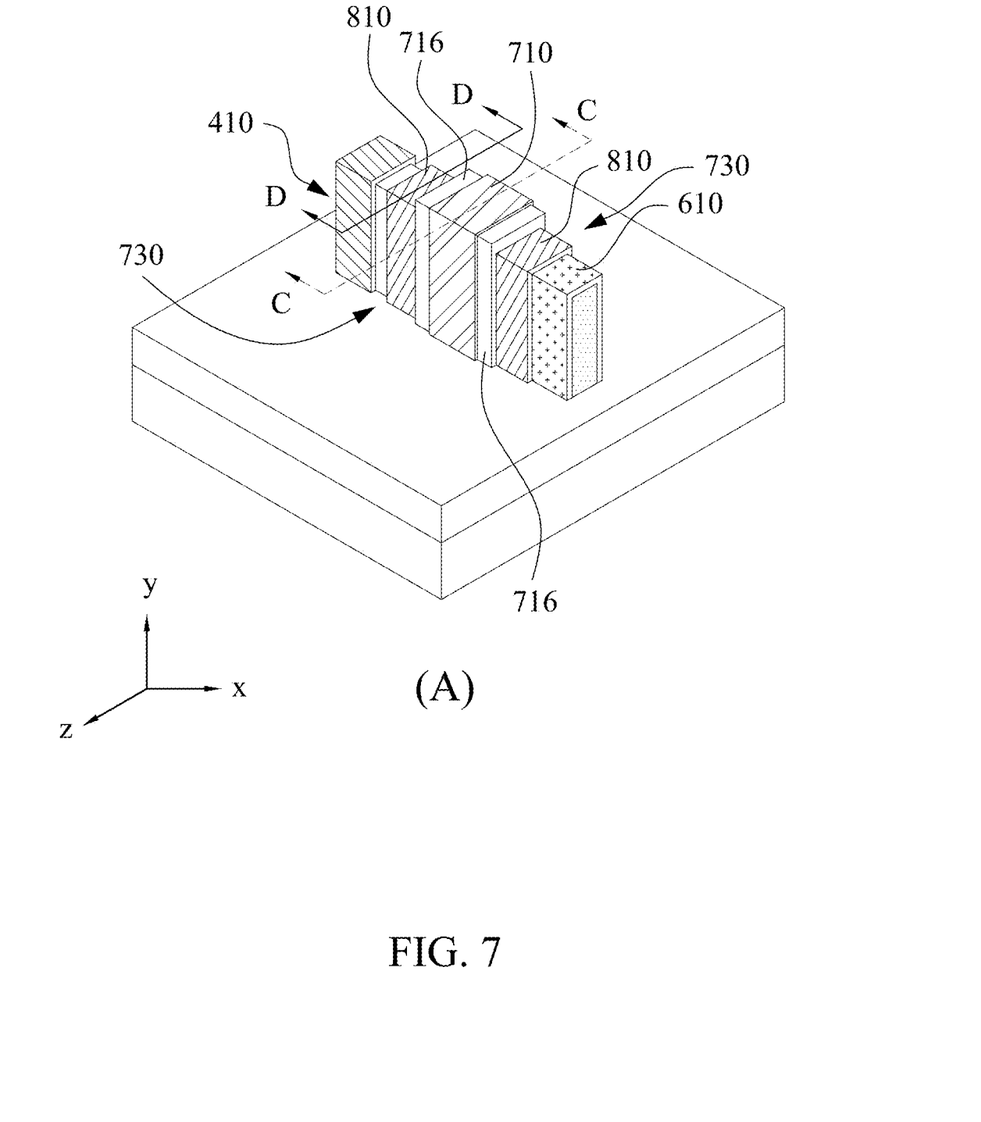

In example operation 150, with reference also to FIG. 7, a device 700 is formed over the 2D semiconductor layer 610. Specifically, in an embodiment, in sub-operation 152, a gate structure 710 is formed over a first portion 720 of the 2D semiconductor layer 610. The first portion 720 of the 2D semiconductor layer 610 includes portions in the first sidewall portion 632, the second sidewall portion 634 and the upper portion 636 of the 2D semiconductor layer 610 and extends over the first sidewall 432, the second sidewall 434 and the upper portion 436 of the dielectric fin structure 420. FIG. 7 shows, as an illustrative example, that the gate structure 710 extends downward until reaching the first dielectric layer 220, which does not limit the scope of the disclosure. In some other embodiment, depending on device design or configuration, the gate structure 710 may not extend all the way downward to the first dielectric layer 220 and another dielectric layer may be formed between the gate structure 710 and the first dielectric layer 220. The depth D1 of the gate structure 710 extending along the z-axis direction over the sidewall portions 632, 634 of the 2D semiconductor layer 610 may be adjusted or designed to tune the gate control of the current passing through the 2D semiconductor layer 610 as a channel of the device 700.

Referring back to FIG. 7, in some embodiments, the gate structure 710 includes a gate electrode 712 and a gate dielectric layer 714. The gate dielectric 714 is formed directly over the upper portion 636 and sidewall portions 632, 634 of the 2D semiconductor layer 610. In some embodiments, the gate dielectric layer 714 may include silicon oxide, silicon nitride, silicon oxy-nitride, or high-k dielectrics. High-k dielectric materials include metal oxides. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or mixtures thereof. In some embodiment, the gate dielectric layer 714 is a high-k dielectric layer with a thickness in the range of about 10 to 30 angstroms (Å). The gate dielectric layer 714 may be formed using a suitable process such as atomic layer deposition (ALD), chemical vapor deposition (CVD), physical vapor deposition (PVD), thermal oxidation, UV-ozone oxidation, or other suitable deposition processes. The gate dielectric layer 714 may further comprise an interfacial layer (not shown) to reduce impacts to the 2D semiconductor layer 610. The interfacial layer may include silicon oxide or other suitable dielectric material.

The gate electrode layer 712 is then formed over the gate dielectric layer 714. In some embodiments, the gate electrode layer 712 may comprise a single layer or multilayer structure. In some embodiment, the gate electrode layer 712 may include poly-silicon doped with the uniform or non-uniform doping concentrations or include a metal material. A metal material for the gate electrode 712 may be Al, Cu, W, Ti, Ta, TIN, TiAl, TiAlN, TaN, NiSi, CoSi, combinations thereof, or other conductive materials with a work function compatible with the 2D semiconductor material of the 2D semiconductor layer 620. In some embodiment, the gate electrode layer 712 includes a thickness in the range of about 30 nm to about 60 nm. The gate electrode layer 712 may be formed using a suitable process such as ALD, CVD, PVD, plating, combinations thereof, or other suitable processes.

FIG. 7 shows, as an illustrative example, a dielectric layer 716 formed over the substrate 210 and adjacent to the gate structure 710. In some embodiments, the dielectric layer 716 may include silicon oxide, silicon nitride, silicon oxynitride, or other suitable dielectric material. The dielectric layer 716 may comprise a single layer or multilayer structure. A blanket layer of the dielectric layer 716 may be formed by CVD, PVD, ALD, or other suitable technique. Then, an anisotropic etching is performed on the blanket dielectric layer 716 to form the dielectric layer 716 as spacer structure(s) adjacent to the gate structure 710.

In example operation 154, with reference still to FIG. 7, a source/drain structure 810 is formed connecting to a second portion 730 of the 2D semiconductor layer 610. The source/drain structures 810 may include one or more layers of a conductive material. The conductive material includes one or more of W, Cu, Co, Ti, Ag, Al, TiAl, TiAlN, TaC, TaCN, TaSN, Mn, Co, Pd, Ni, Re, Ir, Ru, Pt, and Zr, oSc, Er, Y, La, or any other suitable conductive materials. In some embodiments, the source/drain structure 810 may include a first layer or lower contact layer and a second layer or an upper contact layer. The lower contact layer may wrap around the second portions 730 of the 2D semiconductor layer 610 and the upper contact layer is formed over the lower contact layer. In some embodiments, the lower contact layer is configured as a work function adjustment layer. The lower contact layer is Pd, Pt, Ru, Ni, Mg, for pFET or Sc, Er, Y, La, Ni, Mg for nFET. The upper contact layer is one or more of W, Cu and Co in some embodiments, which are metal materials suitable to be interconnection structures under the back-end-of-line processes. The upper contact layer may be configured as a source/drain electrode. In some further embodiment, a third contact layer is formed between the 2D semiconductor layer 610 and the lower contact layer.

As shown in FIG. 7, the source/drain structures 810 are formed adjacent to, or wrapping around, at least three surfaces of the second portions 730, e.g., the upper surface 732, a first sidewall surface 734 and a second sidewall surface 736. One of the metal fin structure 410, 412 may be configured as a body contact terminal of the device 700.

In some embodiment, the second portions 730 of the 2D semiconductor layer 610 are doped to increase the electrical conductivity. In other embodiment, the first portions 720 and the second portions 730 of the 2D semiconductor layer 610 are intrinsic or unintentionally doped.

Figure 8:
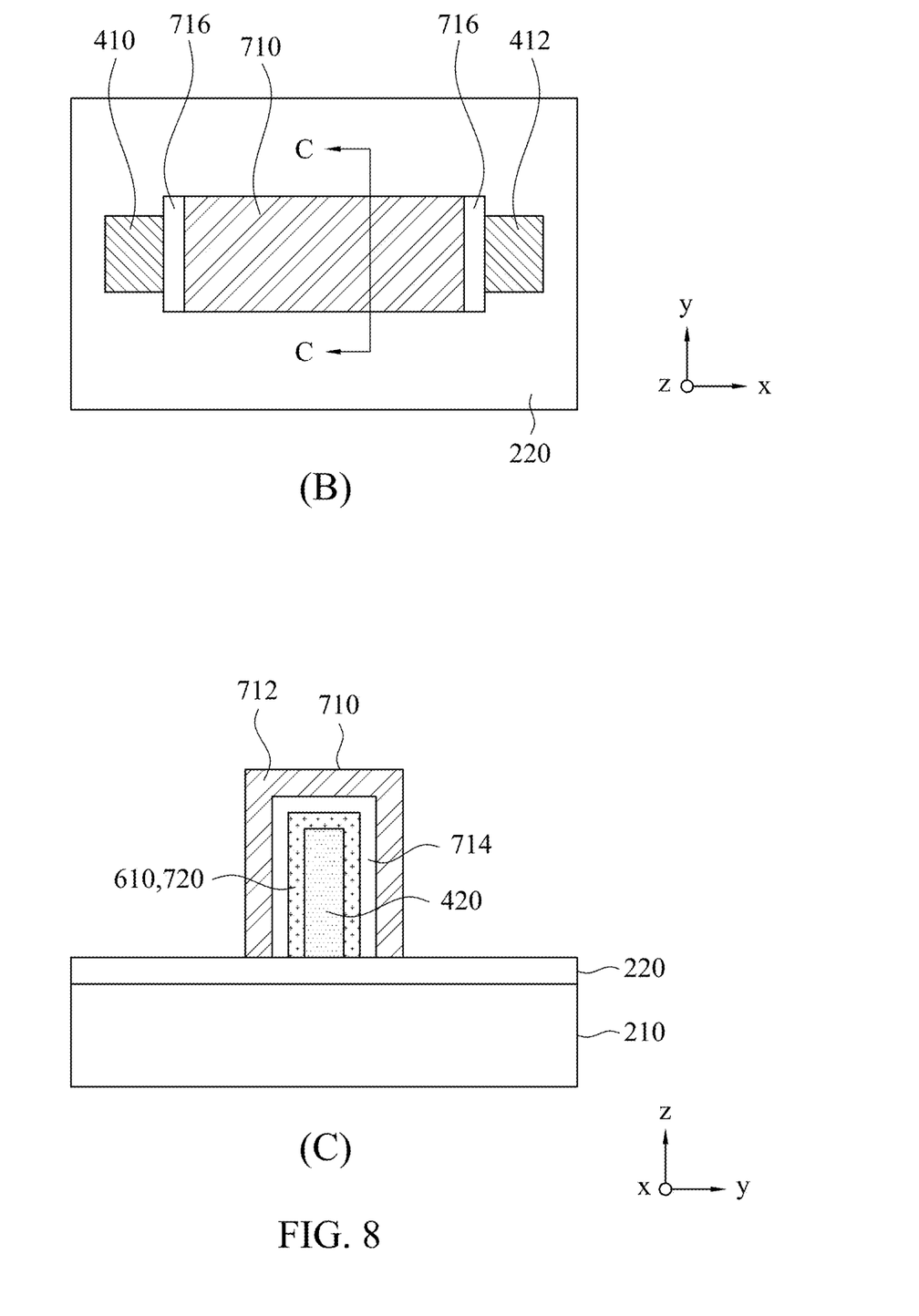

In another embodiment, as shown in FIG. 8, one or both of the metal fin structures 410, 412 are configured as a source/drain structure of the device 700. Because the 2D semiconductor layer 610 is formed using the metal fin structures 410, 412 as the seed layer, the 2D semiconductor layer 610 is also formed over the metal fin structures 410, 412 and connected thereto. An etching process may be performed to expose some surface area of the metal fin structures 410, 412 for interconnection purposes.

In the embodiments of FIG. 7 and FIG. 8, the source/drain structure 810, 410, 412 are separated from the gate structure 710 by the spacer structures 716.

As shown in FIG. 7 or 8, the semiconductor device 700 includes a substrate 210, e.g., a silicon substrate, a dielectric fin structure 420 over the substrate 210, a 2D semiconductor layer 610 over the dielectric fin structure 420. At least a portion, e.g., the first portion 720, of the 2D semiconductor layer 610 is configured as a channel and is adjacent to a gate structure 710. A different portion, e.g., the second portion 730, of the 2D semiconductor layer 610 is configured as a source/drain extension portion and is connected to a source/drain structure 810. A thickness of the layer 610 is smaller than a threshold, depending on the specific 2D materials selected for the layer 610, such that the 2D material of the layer 610 maintains semiconductor properties. One or two metal fin structure 410, 412 are positioned abutting an edge surface 422, 424 of the dielectric fin structure 420 and is connected to the source/drain extension portions 730 of the 2D semiconductor layer 610. The metal fin structure may be configured as a body contact terminal or as a source/drain structure.

The foregoing outlines features of several embodiments so that those skilled in the art may better understand the aspects of the present description. Those skilled in the art should appreciate that they may readily use the present description as a basis for designing or modifying other processes and structures for carrying out the same purposes and/or achieving the same advantages of the embodiments introduced herein. Those skilled in the art should also realize that such equivalent constructions do not depart from the spirit and scope of the present description, and that they may make various changes, substitutions, and alterations herein without departing from the spirit and scope of the present description.

In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The present disclosure may be further appreciated with the description of the following embodiments:

In a structure embodiment, a structure includes a substrate and a first fin structure of a dielectric material over the substrate. The first fin structure has a first sidewall and a second sidewall extending along a first direction and an upper surface meeting between the first sidewall and the second sidewall. A semiconductor layer of a two-dimensional material is disposed over at least the first sidewall and the second sidewall of the first fin structure along the first direction. A gate structure is disposed adjacent to a first portion of the semiconductor layer. A source/drain structure is disposed adjacent to a second portion of the semiconductor layer.

In a method embodiment, a first dielectric layer is formed over a substrate. A metal fin structure is formed over the first dielectric layer. A dielectric fin structure is formed over the first dielectric layer and laterally extending from the first metal fin structure along a first direction. A semiconductor layer of a two-dimensional material is formed over the dielectric fin structure using the metal fin structure as a seed, the semiconductor layer covering at least two sidewall of the dielectric fin along the first direction. A gate structure is formed over a first portion of the semiconductor layer.

In a device embodiment, a device includes a substrate. The substrate includes a dielectric fin structure, which includes a first sidewall, a second sidewall and an upper surface. The device also includes a semiconductor layer extending over the first sidewall, the second sidewall and the upper surface of the dielectric fin structure. A gate structure is disposed over a first portion of the semiconductor layer and extending over the first sidewall, the second sidewall and the upper surface of the dielectric fin structure. A source/drain structure contacts a second portion of the semiconductor layer.

The various embodiments described above can be combined to provide further embodiments. All of the U.S. patents, U.S. patent application publications, U.S. patent applications, foreign patents, foreign patent applications and non patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A structure, comprising:
   a substrate;
   a first structure over the substrate;
   a second structure laterally in contact with an edge surface of the first structure along a first direction, the second structure including a first metal material; and
   a semiconductor layer of a two-dimensional material on the first structure,
   wherein the first metal material of the second structure is a seed material with respect to the two-dimensional material.

2. The structure of claim 1, comprising a dielectric layer between the second structure and the substrate.

3. The structure of claim 1, wherein the second structure has a smaller dimension than the first structure in the first direction.

4. The structure of claim 1, wherein the semiconductor layer is at least partially on a surface of the second structure.

5. The structure of claim 1, wherein the second structure extends beyond the first structure in a second direction that is substantially orthogonal to the first direction.

6. The structure of claim 1, wherein the first metal material is one or more of tungsten, molybdenum, or platinum.

7. The structure of claim 1, further comprising a third structure laterally adjacent to a second edge surface of the first structure, the third structure including the first metal material.

8. The structure of claim 7, wherein the first metal material of the third structure is a seed material with respect to the two-dimensional material of the semiconductor layer.

9. The structure of claim 1, wherein the two-dimensional material is two-dimensional tungsten disulfide.

10. The structure of claim 1, wherein the first structure is a dielectric material.

11. A method, comprising:
    forming a first structure and a second structure over a substrate, the second structure laterally adjacent to an edge portion of the first structure in a first direction, the second structure including a first metal material; and
    forming a semiconductor layer of a two-dimensional material on the first structure using the first metal material as a seed.

12. The method of claim 11, wherein the forming the first structure and the second structure includes:
    forming a dielectric layer of a dielectric material over the substrate;
    forming a metal layer of the first metal material over the substrate and in contact with the dielectric layer; and
    patterning the dielectric layer and the metal layer together.

13. The method of claim 12, wherein the forming the first structure and the second structure includes forming the first structure that has a smaller dimension than the second structure in a second direction that traverses the first direction.

14. The method of claim 11, wherein the two-dimensional material is $WS_2$ and the forming the semiconductor layer of the two-dimensional material includes forming two-dimensional $WS_2$ using $WO_3$ powders and sulfur vapor precursor.

15. The method of claim 14, wherein the forming the second structure includes forming the second structure that includes the first metal material of one or more of tungsten, molybdenum, or platinum.

16. A device, comprising:
    a substrate;
    a first structure over the substrate;
    a second structure laterally in contact with an edge surface of the first structure along a first direction, the second structure including a first metal material; and
    a semiconductor layer of a two-dimensional material on the first structure, the semiconductor layer in contact with the first metal material.

17. The device of claim 16, wherein the second structure is configured to be a source or drain structure.

18. The device of claim 16, wherein the second structure is configured to be a body contact structure.

19. The device of claim 16, further comprising a gate structure on the semiconductor layer of the two-dimensional material on the first structure.

20. The device of claim 16, wherein the two-dimensional material is $WS_2$.

* * * * *